(12) United States Patent
Hsu

(10) Patent No.: US 7,642,634 B2
(45) Date of Patent: Jan. 5, 2010

(54) CHIP PACKAGE AND STACKED STRUCTURE OF CHIP PACKAGES

(75) Inventor: Chi-Hsing Hsu, Hsin-Tien (TW)

(73) Assignee: Via Technologies, Inc., Taipei Hsien (TW)

( * ) Notice: Subject to any disclaimer, the term of this patent is extended or adjusted under 35 U.S.C. 154(b) by 90 days.

(21) Appl. No.: 11/451,848

(22) Filed: Jun. 12, 2006

(65) Prior Publication Data

US 2007/0194426 A1 Aug. 23, 2007

(30) Foreign Application Priority Data

Feb. 21, 2006 (TW) .............................. 95105717 A

(51) Int. Cl.
*H01L 23/02* (2006.01)
(52) U.S. Cl. .................... 257/686; 257/678; 257/733; 257/787; 257/796; 257/E23.001; 257/E23.194
(58) Field of Classification Search ................ 257/686, 257/678, 733, 787, E23.001, E23.194
See application file for complete search history.

(56) References Cited

U.S. PATENT DOCUMENTS

| | | | |
|---|---|---|---|
| 5,870,289 A * | 2/1999 | Tokuda et al. ............. 361/779 |
| 6,388,207 B1 * | 5/2002 | Figueroa et al. ........... 174/262 |
| 6,437,240 B2 * | 8/2002 | Smith ...................... 174/541 |
| 6,531,784 B1 * | 3/2003 | Shim et al. ................ 257/777 |
| 6,762,078 B2 * | 7/2004 | Shin et al. ................. 438/123 |
| 6,953,991 B2 * | 10/2005 | Hatada et al. ............. 257/686 |
| 6,982,475 B1 * | 1/2006 | MacIntyre ................ 257/620 |
| 7,196,898 B2 * | 3/2007 | Osaka et al. ............. 361/321.1 |

* cited by examiner

*Primary Examiner*—Wael Fahmy
*Assistant Examiner*—Marc Armand
(74) *Attorney, Agent, or Firm*—J.C. Patents

(57) ABSTRACT

A chip package is provided, which includes a dielectric layer, at least a conductive layer, a chip, a wiring layer and at least a conductive via. The dielectric layer has a first surface, a second surface opposite to the first surface and a plurality of lateral surfaces joined between the first surface and the second surface. One of the lateral surfaces has at least a groove, wherein the groove is extended from the first surface to the second surface. The conductive layer is disposed on the wall of the groove. The chip is inserted in the dielectric layer. The wiring layer is located on the first surface and electrically connected to the conductive layer. The conductive via is located in the dielectric layer to electrically connect the chip to the wiring layer.

10 Claims, 6 Drawing Sheets

CHIP PACKAGE AND STACKED STRUCTURE OF CHIP PACKAGES

CROSS-REFERENCE TO RELATED APPLICATION

This application claims the priority benefit of Taiwan application serial no. 95105717, filed on Feb. 21, 2006. All disclosure of the Taiwan application is incorporated herein by reference.

BACKGROUND OF THE INVENTION

1. Field of Invention

The present invention relates to a chip package and a stacked structure of chip packages, and particularly to a thinned chip package and a thinned stacked structure of chip packages.

2. Description of the Related Art

In the modern information society, general users prefer electronic products having the feature of high-speed, high-quality and multifunction. In terms of product outlook, the design of electronic goes after the trend of being light, slim, short, and small. To achieve the above-mentioned object, many manufacturers introduce the concept of systematization into a circuit design to save the number of chips disposed in an electronic product. On the other hand, in terms of electronic packaging, for the design trend of being light, slim, short, and small, several package design concepts are developed, such as multi-chip module (MCM), chip scale package (CSP) and a stacked structure of chip packages.

FIG. 1 is a cross-sectional view of a conventional stacked structure of chip packages. Referring to FIG. 1, a conventional stacked structure of chip packages 100 includes a plurality of stacked chip packages 200a and 200b and a plurality of solder balls 250, wherein the chip package 200a stacked over the chip package 200b is fixed on the chip package 200b by the solder balls 250 and electrically connected to the chip package 200b via the solder balls 250. Each of the chip packages 200a and 200b includes a package carrier plate 210, a chip 220, a plurality of bumps 230, and an underfill 240. The chip 220 and the bumps 230 are disposed on the package carrier plate 210 and the chip 220 is electrically connected to the package carrier plate 210 via the bumps 230. The underfill 240 is disposed between the chip 220 and the package carrier plate 210 to encapsulate the bumps 230 and buffer the thermal stress occurring between the chip 220 and the package carrier plate 210.

The package carrier plate 210 has a plurality of conductive posts 212 and a plurality of bonding pads 214, wherein the conductive posts 212 run through the package carrier plate 210, respectively, and the bonding pads 214 are also disposed on the conductive posts 212, respectively. Besides, the solder balls 250 are further disposed between the bonding pads 214 of the chip package 200a and the bonding pads 214 of the chip package 200b, respectively. In this way, the chip packages 200a and 200b are able to electrically connect each other via the solder balls 250.

Note that the package carrier plate 210 and the chip 220 possess a certain thickness, respectively, and the bumps 230 and the solder balls 250 possess a certain height as well. Consequently, it makes the chip packages 200a and 200b keep a certain thickness, and it is hard to have the chip packages 200a and 200b thinned. Thus, for the conventional stacked structure of chip packages 100 formed by a plurality of alternately stacked chip packages (200a, 200b . . . ), the total thickness thereof would be remarkably increased, so that it cannot meet the modern design demand. In short, limited by a certain volume or thickness, it is hard to advance the package density of a conventional stacked structure of chip packages 100.

SUMMARY OF THE INVENTION

The present invention provides a chip package, which includes a dielectric layer, at least a conductive layer, a chip, a wiring layer and at least a conductive via. The dielectric layer has a first surface, a second surface opposite to the first surface and a plurality of lateral surfaces joined between the first surface and the second surface. One of the lateral surfaces has at least a groove, wherein the groove is extended from the first surface to the second surface. The conductive layer is disposed on the wall of the groove. The chip is inserted in the dielectric layer. The wiring layer is located on the first surface and electrically connected to the conductive layer. The conductive via is located in the dielectric layer to electrically connect the chip to the wiring layer.

The present invention further provides a stacked structure of chip packages, which includes a plurality of chip packages and at least a conductive post. The chip packages are alternately stacked by one another, and each chip package includes a dielectric layer, at least a conductive layer, a chip, a wiring layer and at least a first conductive via. The dielectric layer has a first surface, a second surface opposite to the first surface, and a plurality of lateral surfaces joined between the first surface and the second surface. One of the lateral surfaces has at least a groove, wherein the groove is extended from the first surface to the second surface. The conductive layer is disposed on the wall of the groove. The chip is inserted in the dielectric layer. The wiring layer is located on the first surface and electrically connected to the conductive layer. The conductive via is located in the dielectric layer to electrically connect the chip to the wiring layer. The lateral surfaces having the grooves face in the same direction, and the groove located on an upper chip package corresponds to the groove located on a lower chip package. The conductive posts are disposed in the grooves and are connected to the conductive layers.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1:
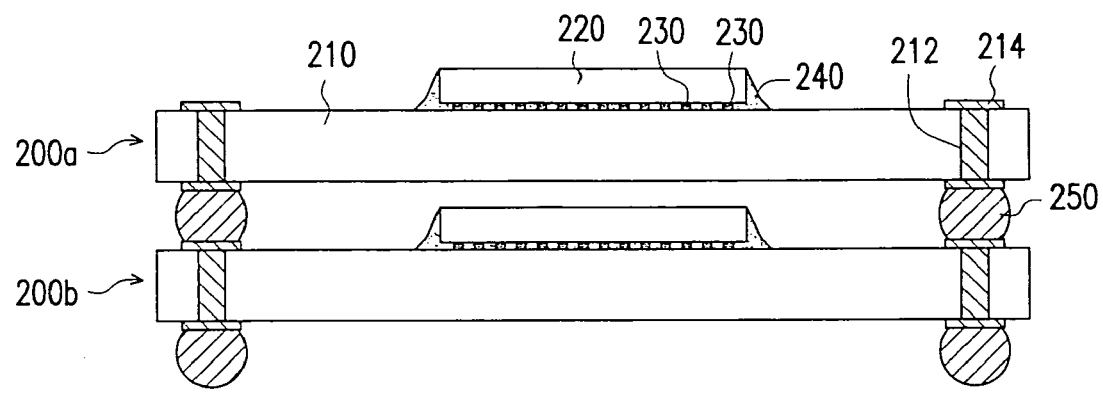
FIG. 1 is a cross-sectional view of a conventional stacked structure of chip packages.
Figure 2:
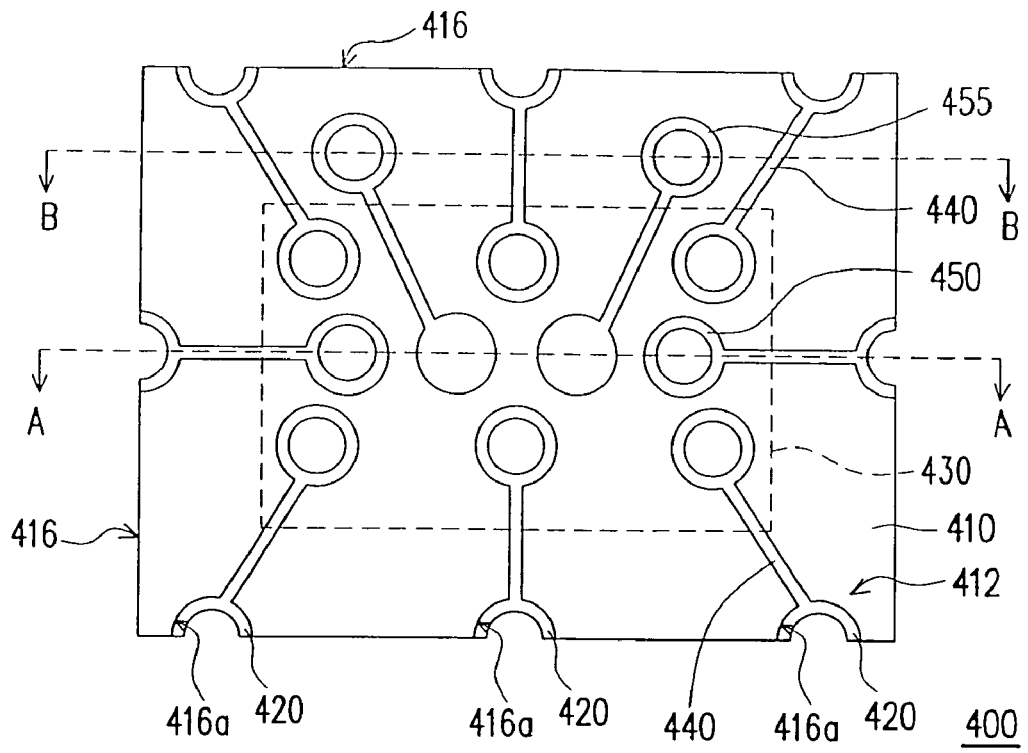
FIG. 2 is a top view of a chip package according to an embodiment of the present invention.
Figure 3:
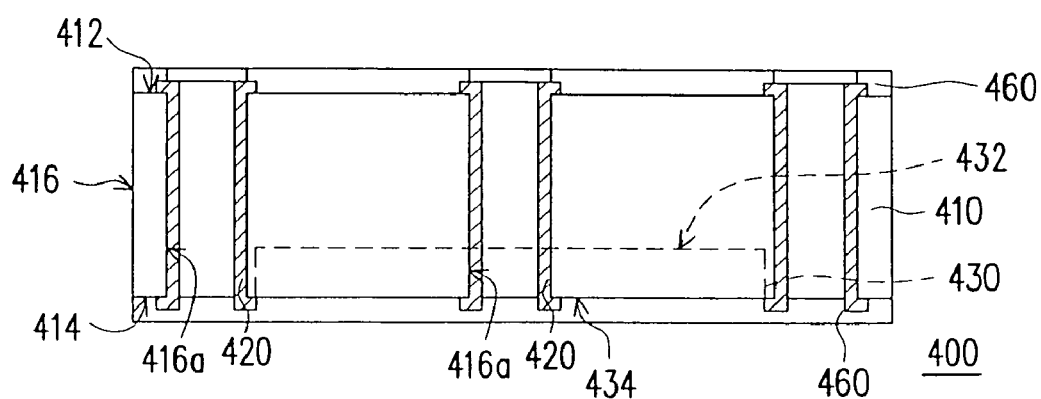
FIG. 3 is the side view of the chip package in FIG. 2.

FIG. 2 is a top view of a chip package according to an embodiment of the present invention. FIG. 3 is the side view of the chip package in FIG. 2. Referring to FIGS. 2 and 3, a chip package 400 according to the embodiment of the present invention mainly includes a dielectric layer 410, at least a conductive layer 420, a first chip 430, a first wiring layer 440, and a plurality of conductive vias 450. The dielectric layer 410 has a first surface 412, a second surface 414, and a plurality of lateral surfaces 416. The second surface 414 is opposite to the first surface 412, and the lateralsurfaces 416 are joined between the first surface 412 and the second surface 414. The lateral surfaces 416 have a plurality of grooves 416a. The conductive layers 420 are disposed on the walls of the grooves 416a and exposed from the lateral surfaces 416, respectively.

Note that the present embodiment is not limited to the number of the lateral surfaces 416 having the grooves 416a. In other embodiments of the present invention, the dielectric layer 410 can have more than two lateral surfaces 416 and a plurality of grooves 416a is made on each of the lateral surfaces 416. Besides, the present embodiment is not limited to a single lateral surface 416 which must have a plurality of grooves 416a. In fact, in other embodiments of the present invention, a single lateral surface 416 is allowed to have a groove 416a only. The material of the above-mentioned dielectric layer 410 is, for example, epoxy, bismaleimide-triazine (BT), prepreg, ceramic or other dielectric materials.

The first chip 430 has an active surface 432 and a back surface 434. The first chip 430 is inserted in the dielectric layer 410, and the back surface 434 of the first chip 430 is exposed outside the dielectric layer 410. However, this embodiment does not limit the present invention. For example, in other embodiments of the present invention, the back surface 434 of the first chip 430 can be covered by the dielectric layer 410. The first wiring layer 440 is located on the first surface 412 and electrically connects the conductive layers 420 disposed on the grooves 416a, respectively. It should be noted that although the first wiring layer 440 in the embodiment is a single patterned metal layer, in other embodiments of the present invention, the first wiring layer 440 can be formed by a plurality of patterned metal layers and a plurality of dielectric layer, which are alternately stacked by one another.

Figure 4:
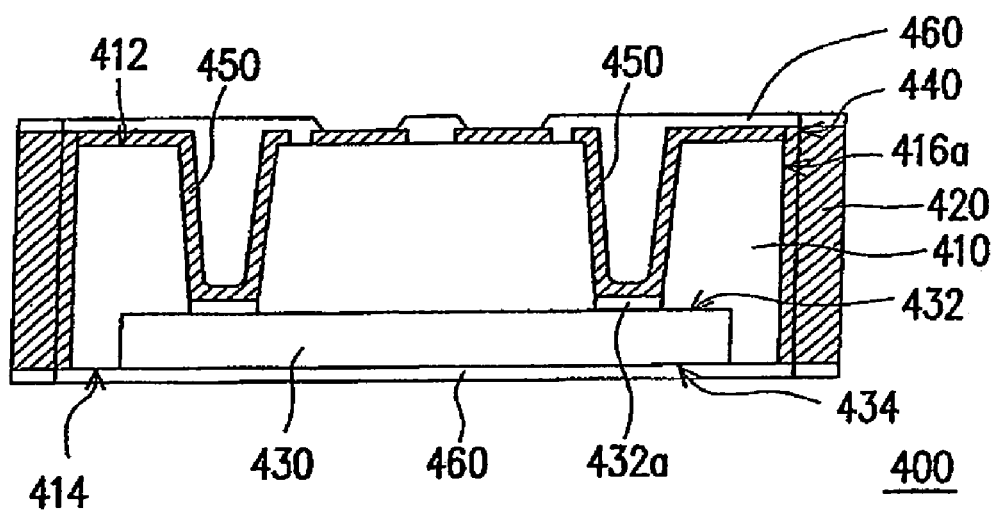
FIG. 4 is a cross-sectional view along line A-A in FIG. 2.

FIG. 4 is a cross-sectional view along the line A-A in FIG. 2. Referring to FIGS. 4 and 2, the first conductive vias 450 are located in the dielectric layer 410 for electrically connecting the active surface 432 of the first chip 430 to the first wiring layer 440. The active surface 432 of the first chip 430 has at least a pad 432a, and the dielectric layer 410 covers the active surface 432 except for the pad 432a. In the embodiment, the first conductive via 450 is formed by forming a blind hole at a predetermined position of the dielectric layer 410 and then forming a metal layer on the wall of the blind hole. In other embodiments of the present invention, it is allowed to form the first conductive via 450 in other manners. For example, the present invention allows to dispose a metal post in the blind hole to form the first conductive via 450, wherein the metal post is formed by means of hole-filled plating.

Figure 5:
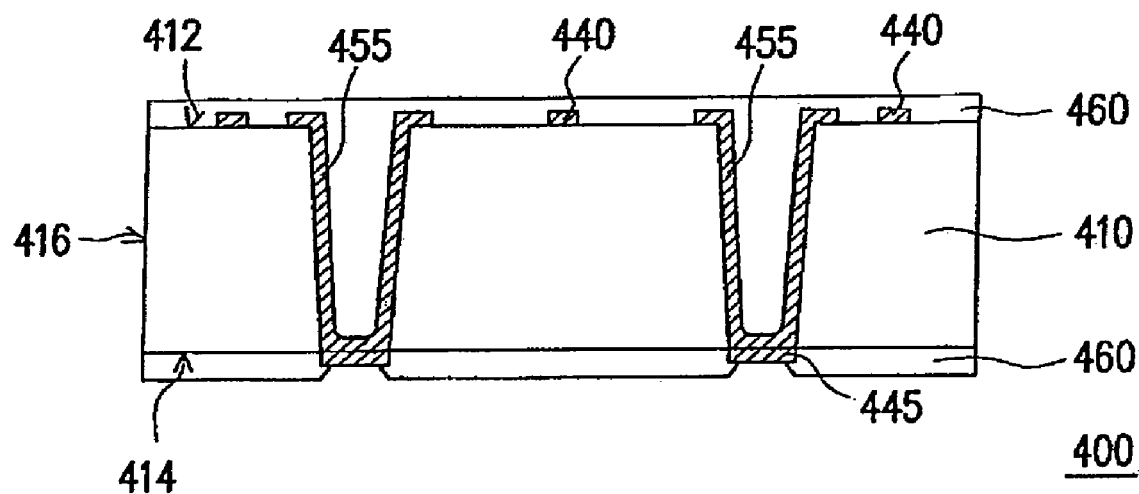
FIG. 5 is a cross-sectional view along line B-B in FIG. 2.

In addition, the chip package 400 of the embodiment further can have another wiring layer on the second surface 414 of the dielectric layer 410. FIG. 5 is a cross-sectional view along the line B-B in FIG. 2. Referring to FIGS. 2 and 5, the chip package 400 can have a second wiring layer 445 and at least a second conductive via 455. The second wiring layer 445 is located on the second surface 414 of the dielectric layer 410. The second conductive via 455 is located in the dielectric layer 410, while the second wiring layer 445 is electrically connected to the first wiring layer 440 through the second conductive via 455.

In the embodiment, solder mask layers 460 can be further disposed on the first surface 412 and the first wiring layer 440 and on the second surface 414 and the second wiring layer 445. The solder mask layers 460 have a plurality of openings, which expose a plurality of connection points of the first wiring layer 440 and the second wiring layer 445. Besides, in the embodiment, the back surface 434 of the first chip 430 can be covered, so as to prevent the first chip 430 from damage caused by external factors, such as moisture and so on.

Figure 6:
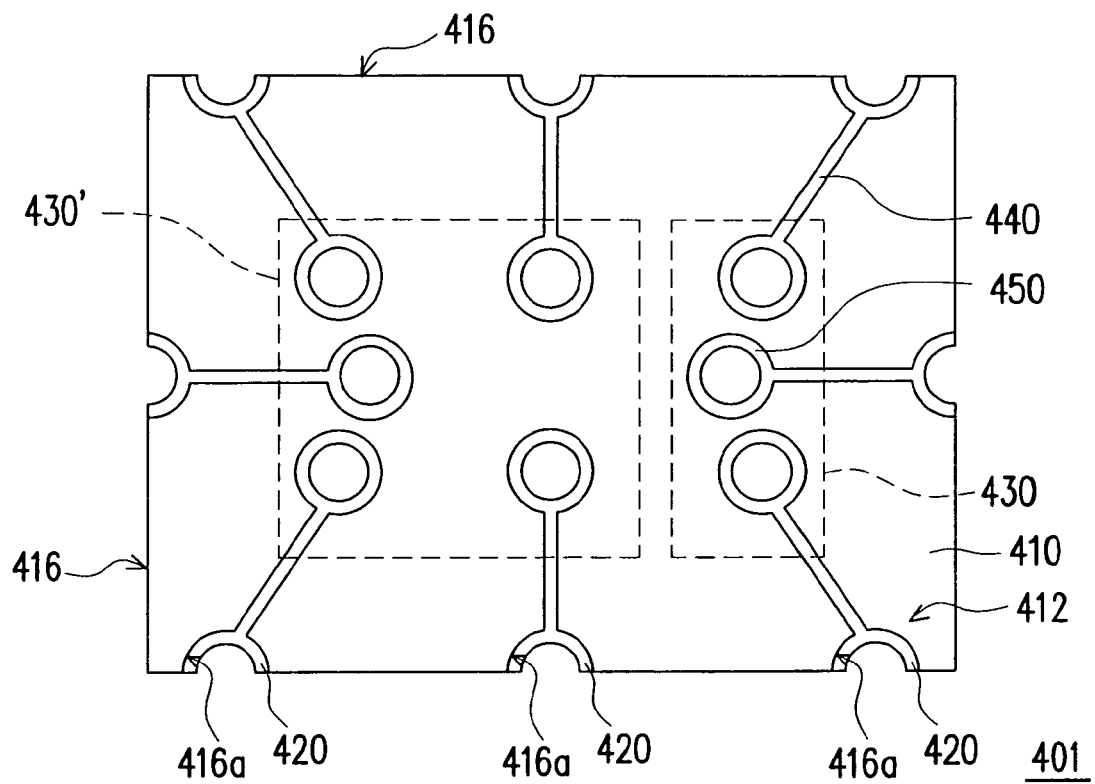
FIG. 6 is a top view of a chip package according to another embodiment of the present invention.

Although the chip package 400 in the embodiment has a first chip 430 only, the embodiment does not limit the present invention. In other embodiments of the present invention, the chip package 400 can have at least a second chip. FIG. 6 is a top view of a chip package according to another embodiment of the present invention. Referring to FIG. 6, the structure of the chip package 401 is similar to the chip package 400. However, the chip package 401 further has a second chip 430' in addition to the first chip 430. In fact, a single chip package 401 can include a plurality of chips (430, 430' . . . ).

Figure 7:
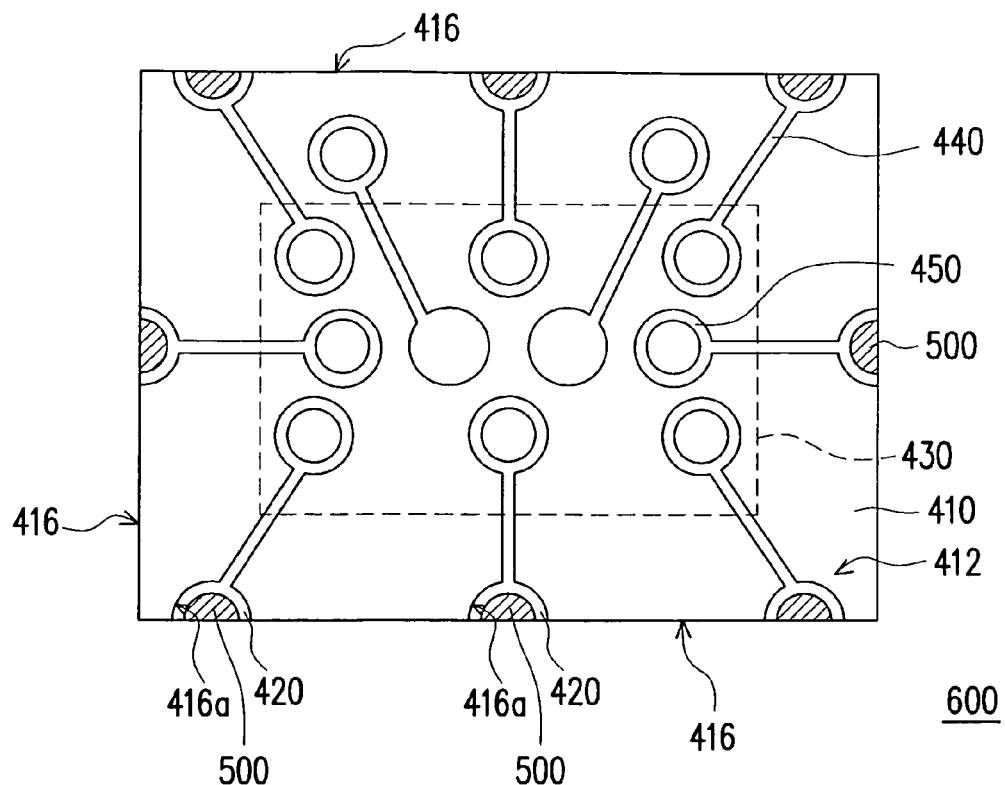
FIG. 7 is a top view of a stacked structure of chip packages according to yet another embodiment of the present invention.
Figure 8:
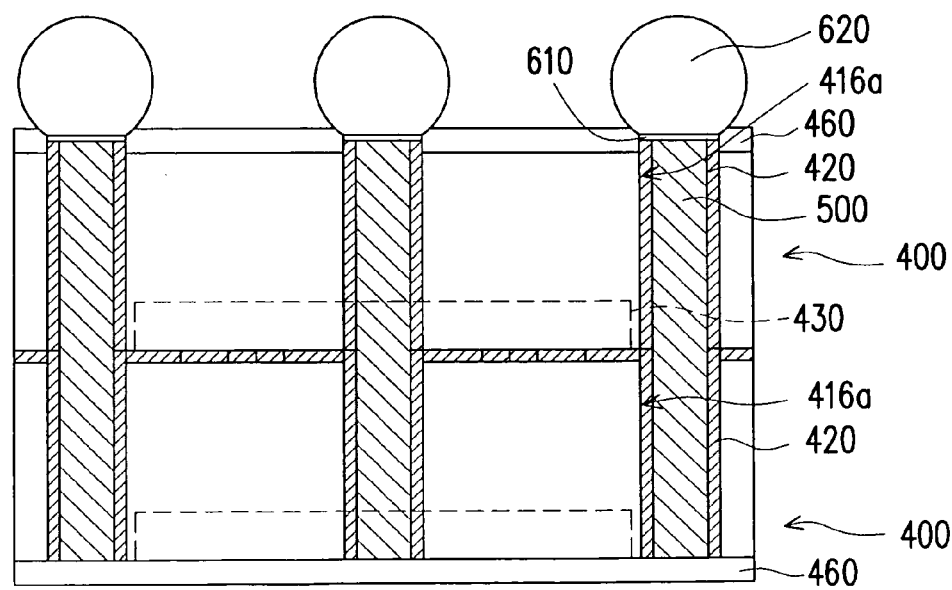
FIG. 8 is the side view of the stacked structure of chip packages in FIG. 7.

In the present invention, a plurality of chip packages 400 as shown in FIG. 2 can further be stacked by one another to form a stacked structure of chip packages. FIG. 7 is a top view of a stacked structure of chip packages according to yet another embodiment of the present invention. FIG. 8 is the side view of the stacked structure of chip packages in FIG. 7. Referring to FIGS. 7 and 8, a stacked structure of chip packages 600 mainly includes a plurality of chip packages 400 stacked by one another and a plurality of conductive posts 500. The lateral surfaces 416 with grooves 416a of the chip packages 400 are disposed in the predetermined directions, so that the grooves 416a located on an upper chip package 400 correspond to the grooves 416a located on a lower chip package 400. In the embodiment, the conductive posts 500 are disposed in the grooves 416a which are substantially arranged along a line and are connected to the conductive layers 420 in the grooves 416a, wherein the conductive posts 500 are formed by, for example, soldering, plating or other processes. In this way, the chip packages 400 are able to be electrically connected to one another through the conductive posts 500. Besides, the stacked structure of chip packages 600 can, as shown in FIG. 8, includes a plurality of bonding pads 610 and a plurality of solder balls 620, wherein the bonding pads 610 are disposed at one end of the conductive posts 500, while the solder balls 620 are disposed on the bonding pads 610. Thus, the stacked structure of chip packages 600 is able to be connected to a circuit board or another chip package via the solder balls 620.

Figure 9:
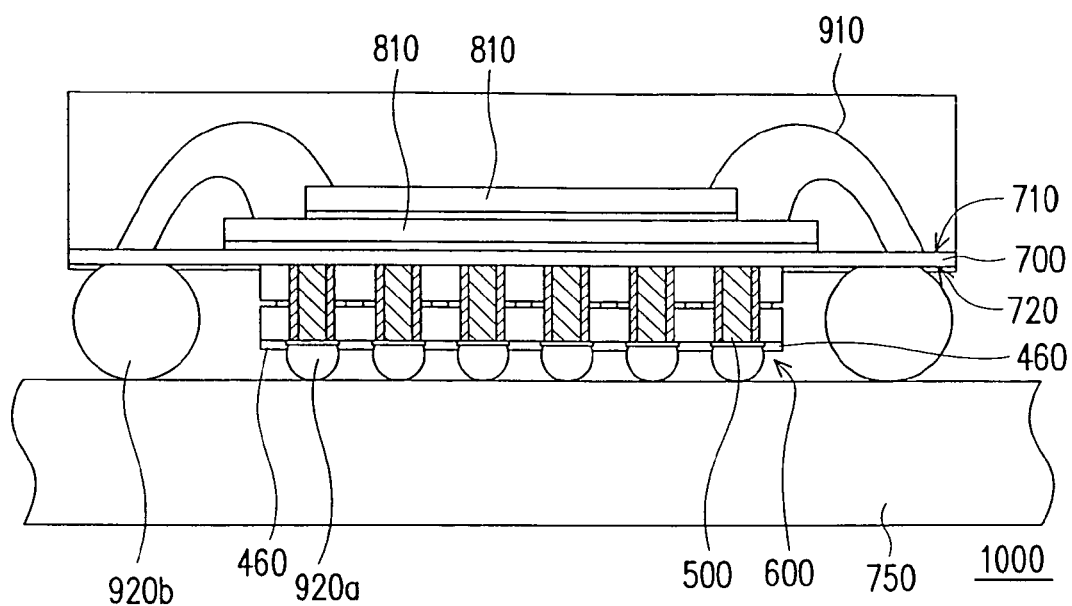
FIG. 9 is a diagram showing the stacked structure of chip packages in FIG. 7 assembled with a circuit board.

From the above described, depending on a practical need, the stacked structure of chip packages 600 provided by the present embodiment in FIGS. 7 and 8 can be assembled together with other chip packages on the same circuit board. FIG. 9 is a diagram showing the stacked structure of chip packages in FIG. 7 assembled with a circuit board. Referring to FIG. 9, an electronic module 1000 mainly includes a stacked structure of chip packages 600, a package substrate 700, a plurality of chips 810 and a circuit board 750. The package substrate 700 has an upper surface 710 and a lower surface 720 opposite to the upper surface 710. The chips 810 are sequentially stacked on the upper surface 710 and are electrically connected to the package substrate 700 via a plurality of conductive wires 910. The package substrate 700 is electrically connected to the circuit board 750 via a plurality of solder balls 920b.

Since the thickness of the stacked structure of chip packages 600 can be shrank to less than 200 micron (μm), the stacked structure of chip packages 600 of the embodiment is allowed to be disposed on the lower surface 720 and between the package substrate 700 and the circuit board 750, wherein the conductive posts 500 are electrically connected to the circuit board 750 via the solder balls 920*a*. In addition, anyone skilled in the art can make a combination from the above-described designs or modifications. For example, every conductive post 500 of the stacked structure of chip packages 600 can be electrically connected to the package substrate 700 via the solder balls 620 (as shown in FIG. 8) in addition to being directly connected to the package substrate 700.

It can be further seen that the stacked structure of chip packages provided by the present invention (for example, the stacked structure of chip packages 600 in FIG. 9) can be electrically connected to the same circuit board together with other chips in different forms.

In comparison with the prior art, the chip package of the present invention has no conventional package carrier plate; instead, the chips are inserted or embedded in the dielectric layer, so that the chip package of the present invention would have a thinner thickness. Besides, the object of a thinner chip package is achieved by the present invention, and the chip packages in the stacked structure of chip packages provided by the present invention are electrically connected to each other through the conductive layers on the lateral surfaces of the dielectric layer and the conductive posts. Hence the stacked structure of chip packages provided by the present invention has higher package density. Furthermore, since the stacked structure of chip packages of the present invention takes advantage of conductive layers on the lateral surfaces of the dielectric layer and the conductive posts to electrically connect two adjacent chip packages, the stacked structure of chip packages possesses shorter signal transmission paths, so that the stacked structure of chip packages of the present invention would have better electrical performance.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A chip package, comprising:
    a dielectric layer, having a first surface, a second surface, and a plurality of lateral surfaces joined between the first surface and the second surface, wherein one of the lateral surfaces has at least a groove and the groove is exposed from the lateral surfaces;
    at least a conductive layer, disposed in the groove and exposed from the groove of the lateral surfaces;
    a first chip, inserted in the dielectric layer, wherein the first chip has an active surface with at least a pad and a back surface, and the dielectric layer covers the active surface except for the pad;
    a first wiring layer, located on the first surface and electrically connected to the conductive layer;
    at least a first conductive via, located in the dielectric layer for electrically connecting the first chip to the first wiring layer;
    at least a second chip: and
    at least a third conductive via, wherein the second chin and the third conductive via are located in the dielectric layer, wherein the third conductive via electrically connects the first wiring layer to the second chip.

2. The chip package as recited in claim 1, further comprising a solder mask layer disposed on the first surface and the first wiring layer.

3. The chip package as recited in claim 1, wherein the back surface is exposed from the dielectric layer, and the first conductive via electrically connects the active surface to the first wiring layer.

4. The chip package as recited in claim 1, wherein the dielectric layer covers the back surface of the first chip, and the first conductive via connects the active surface to the first wiring layer.

5. The chip package as recited in claim 1, further comprising a second wiring layer and at least a second conductive via, wherein the second wiring layer is located on the second surface, and the second conductive via is located in the dielectric layer.

6. The chip package as recited in claim 1, further comprising a solder mask layer disposed on the second surface and the second wiring layer.

7. The chip package as recited in claim 1, wherein the first wiring layer is a patterned metal layer.

8. The chip package as recited in claim 1, wherein the first wiring layer is formed by a plurality of patterned metal layers and a plurality of dielectric layers.

9. The chip package as recited in claim 1, wherein the groove is extended from the first surface to the second surface.

10. The chip package as recited in claim 1, wherein the lateral surfaces are located at periphery of the dielectric layer.

* * * * *